(12) United States Patent
Bellippady et al.

(10) Patent No.: US 7,697,330 B1
(45) Date of Patent: Apr. 13, 2010

(54) NON-VOLATILE MEMORY ARRAY HAVING DRAIN-SIDE SEGMENTATION FOR AN FPGA DEVICE

(75) Inventors: Vidyahara Bellippady, San Jose, CA (US); Santosh Yachareni, San Jose, CA (US); Fethi Dhaoui, Patterson, CA (US); Zhigang Wang, Sunnyvale, CA (US)

(73) Assignee: Actel Corporation, Mountain View, CA (US)

( * ) Notice: Subject to any disclaimer, the term of this patent is extended or adjusted under 35 U.S.C. 154(b) by 84 days.

(21) Appl. No.: 11/961,203

(22) Filed: Dec. 20, 2007

(51) Int. Cl.
*G11C 16/00* (2006.01)
(52) U.S. Cl. ............................. 365/185.05; 365/185.06; 365/185.11
(58) Field of Classification Search ................ 365/185.1
See application file for complete search history.

(56) References Cited

U.S. PATENT DOCUMENTS

| | | | | |
|---|---|---|---|---|
| 5,583,808 A | * | 12/1996 | Brahmbhatt | 365/185.05 |
| 5,898,616 A | * | 4/1999 | Ono | 365/185.17 |
| 6,288,938 B1 | * | 9/2001 | Park et al. | 365/185.08 |
| 6,307,780 B1 | * | 10/2001 | Tanaka et al. | 365/185.13 |

* cited by examiner

*Primary Examiner*—Tan T. Nguyen
(74) *Attorney, Agent, or Firm*—Lewis and Roca LLP

(57) ABSTRACT

A non-volatile memory array for an FPGA comprises a plurality of memory cells arranged in rows and columns and divided into a plurality of row segments. The source of each non-volatile memory transistor in each segment is coupled together to a common source line. A column segment line is associated with each segment of the array, and is coupled to the drains of each non-volatile memory transistor in the segment. A segment select transistor is coupled between each column segment line and its associated column line, and a high-voltage driver transistor is coupled to each column line.

28 Claims, 3 Drawing Sheets

NON-VOLATILE MEMORY ARRAY HAVING DRAIN-SIDE SEGMENTATION FOR AN FPGA DEVICE

BACKGROUND OF THE INVENTION

1. Field of the Invention

The present invention relates to field-programmable gate array (FPGA) devices. More particularly, the present invention relates to FPGA devices using Flash memory for programming, and to an efficient segmentation of Flash memory for FPGA applications.

2. The Prior Art

Arrays of flash memory cells for use in FPGA applications are known, and include a plurality of rows and columns of non-volatile memory cells disposed in a plurality of rows and a plurality of columns Each memory cell includes a floating-gate programming transistor and a floating-gate switch transistor sharing its floating gate with that of the programming transistor. A row line is electrically connected to the control gates of each first and second floating-gate transistor in its row. The arrays are divided into a plurality of segments that each include a plurality of rows of memory cells in which the sources of the floating-gate programming transistors in each column are connected to a separate segment source-column line. All of the segment source-column lines are connected to a common source line through source-segment select transistors all controlled by a global read line. The drains of the floating-gate programming transistors in each column of each segment are connected to a segment drain-column line. A master column line is associated with each column in the array. A segment-select transistor is connected between its segment drain-column line and its master column line and is controlled by a segment-select line to connect the segment drain-column line to the master column line. For writing, the segment source lines are connected to the segment drain lines through write transistors controlled by a global write-mode line. Such arrays are found, for example, in products sold under the name "ProASIC3" by Actel Corporation of Mountain View, Calif.

BRIEF DESCRIPTION OF THE INVENTION

According to one aspect of the present invention, a non-volatile memory array for an FPGA comprises a plurality of memory cells arranged in rows and columns and divided into a plurality of row segments. The source of each non-volatile memory transistor in each segment is coupled together to a common source line. A column segment line is associated with each segment of the array, and is coupled to the drains of each non-volatile memory transistor in the segment. A segment select transistor is coupled between each column segment line and its associated column line, and a high-voltage driver transistor is coupled to each column line.

According to another aspect of the present invention, the common source lines are not segmented but run the entire length of every column.

According to yet another embodiment of the invention, neighboring ones of the non-volatile memory transistors in adjacent pairs share a common column line.

BRIEF DESCRIPTION OF THE DRAWING FIGURES

DETAILED DESCRIPTION OF THE INVENTION

Persons of ordinary skill in the art will realize that the following description of the present invention is illustrative only and not in any way limiting. Other embodiments of the invention will readily suggest themselves to such skilled persons.

Figure 1:
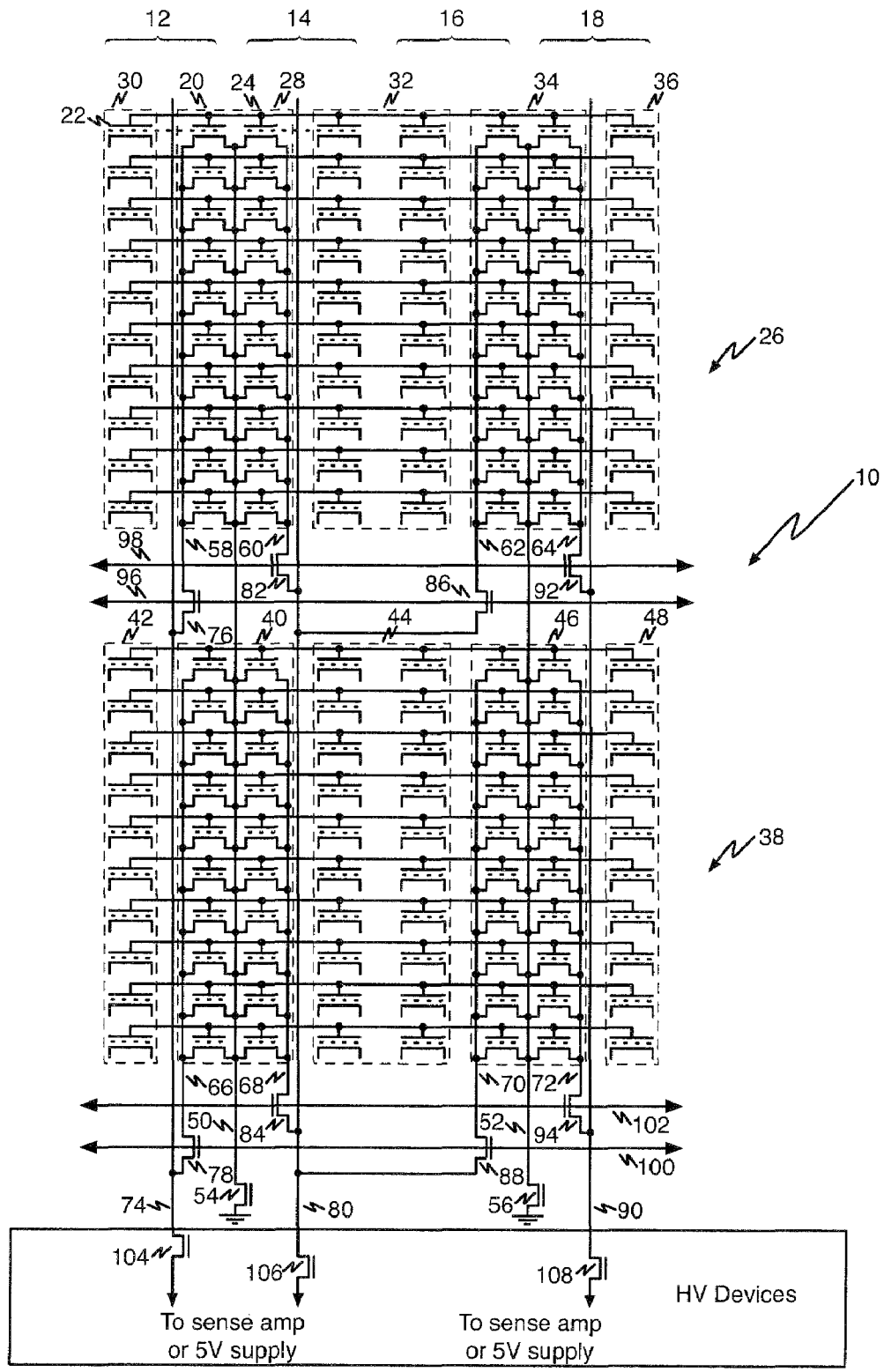
FIG. 1 is a schematic diagram of a portion of a segmented Flash memory array according to one aspect of the present invention.

Referring first to FIG. 1, a simplified schematic diagram shows a portion of a non-volatile memory array 10 according to one aspect of the present invention. Memory array 10 includes a plurality of memory cells that employ two different sizes of non-volatile transistors. In FIG. 1, the transistors are shown as floating-gate flash transistors, but persons of ordinary skill in the art will appreciate that transistors utilizing other types of charge-storage mechanisms may be used in the present invention.

The portion of the illustrative memory array 10 shown in FIG. 1 has twenty rows. Each row is shown having four memory cells. Each memory cell has two transistors, as shown bracketed at the top row with reference numerals 12, 14, 16, and 18. Persons of ordinary skill in the art will appreciate that the portion of the array shown in FIG. 1 is for illustration only, and the size and configuration of an actual memory array fabricated according to the principles of the present invention will be largely dictated by design choice in light of the particular application.

The smaller-sized transistors (an illustrative one of which is designated by reference numeral 20 in FIG. 1) are programming transistors (also referred to herein as memory transistors) and the larger-sized transistors (an illustrative one of which is designated by reference numeral 22 in FIG. 1) are switch transistors. The memory transistors are used to program and erase the memory cells and the switch transistors are used to make programmable connections between circuit elements and interconnect conductors in the FPGA device as is known in the art. Individual memory transistors share their floating gates with one or more switch transistors that they control. For example, and as shown in FIG. 1, memory transistor 20 shares its floating gate with switch transistor 22 and memory transistor 24 shares its floating gate with switch transistor 32. The floating gates of the other pairs of memory and switch transistors are similarly connected together but are not shown connected in FIG. 1 in order to avoid overcomplicating the drawing and unintentionally obscuring the disclosure.

The memory transistors and the switch transistors are formed in different p-wells. As shown in FIG. 1, the programming transistors in the memory cells may be mirrored such that one p-well contains two programming transistors (e.g., programming transistors designated by reference numerals 20 and 24) that share a common source region. The transistors in different segments are also segregated as a consequence of being formed in different p-wells. Thus, the first and second columns of memory transistors in the upper segment 26 are formed in p-well 28. The switch transistors associated with the first column are formed in p-well 30 and the switch transistors associated with the second and third columns are formed in p-well 32. The third and fourth columns of memory transistors in the upper segment are formed in p-well 34. The switch transistors associated with the fourth column are formed in p-well 36. Persons of ordinary skill in the art will appreciate that switch transistors in adjacent columns in the interior of the array may be formed in the same p-well; e.g., as illustrated by the switch transistors in the second and third columns of the array could all be formed in the same p-well 32.

The transistors in the lower segment 38 are similarly situated. The first and second columns of memory transistors in the lower segment are formed in p-well 40. The switch transistors associated with the first column in the lower segment are formed in p-well 42 and the switch transistors associated with the second and third columns in the lower segment are formed in p-well 44. The third and fourth columns of memory transistors in the lower segment are formed in p-well 46. The switch transistors associated with the fourth column in the lower segment are formed in p-well 48.

The sources of all of the pairs of memory transistors in the first and second columns of the array are coupled together to a common source line 50. The sources of all of the pairs of memory transistors in the third and fourth columns of the array are coupled together to a common source line 52. Source biasing for both segments of the memory array is provided by source-bias transistors 54 and 56 that are located in a row-decoder area of the integrated circuit. Persons of ordinary skill in the art will observe that common source lines 50 and 52 are global for all of the memory cells in the four columns illustrated in FIG. 1. Source-bias transistors 54 and 56 are driven by logic signals from a row-decoder area of the integrated circuit.

According to the present invention, the memory array is drain-side segmented. The portion of the array depicted in FIG. 1 shows ten rows of memory cells in each of upper and lower memory array segments 26 and 38. The drains of all of the programming transistors in the first column of the top segment of the array are connected together to a common drain line 58 and the drains of all of the programming transistors in the second column of the top segment of the array are connected together to a common drain line 60. The drains of all of the programming transistors in the third column of the top segment of the array are connected together to a common drain line 62 and the drains of all of the programming transistors in the fourth column of the top segment of the array are connected together to a common drain line 64.

In similar fashion, the drains of all of the programming transistors in the first column of the lower segment of the array are connected together to a common drain line 66 and the drains of all of the programming transistors in the second column of the bottom segment of the array are connected together to a common drain line 68. The drains of all of the programming transistors in the third column of the bottom segment of the array are connected together to a common drain line 70 and the drains of all of the programming transistors in the fourth column of the bottom segment of the array are connected together to a common drain line 72.

The drain lines of the top and bottom segments of the array are coupled to column lines through high-voltage segment-select transistors. Thus, drain lines 58 and 66 of the upper and lower segments in the first column of the array are coupled to a column line 74 through segment-select transistors 76 and 78, respectively. Similarly, drain lines 60 and 68 of the upper and lower segments in the second column of the array are coupled to a column line 80 through segment-select transistors 82 and 84, respectively. Drain lines 62 and 70 of the upper and lower segments in the third column of the array share column line 80 with the drains of the memory transistors in the second column and are thus coupled to the column line 80 through segment-select transistors 86 and 88, respectively.

Drain lines 64 and 72 of the upper and lower segments in the fourth column of the array are coupled to a column line 90 through segment-select transistors 92 and 94, respectively. One segment-select transistor is used for each cluster of rows making up a segment. The number of drain lines that share a single column line (i.e., 60 and 68 sharing column line 80 with drain lines 62 and 70) may be increased. Persons of ordinary skill in the art will appreciate that decisions concerning such sharing involve a trade-off between metal resources and programming time.

The gates of transistors 76 and 86 controlling the upper drain segments of the first and third columns are coupled to an enable line 96; the gates of transistors 82 and 92 controlling the upper drain segments of the second and fourth columns are coupled to an enable line 98; the gates of transistors 78 and 88 controlling the lower drain segments of the first and third columns are coupled to an enable line 100; the gates of transistors 84 and 94 controlling the lower drain segments of the second and fourth columns are coupled to an enable line 102. Enable lines 96, 98, 100, and 102 may be driven by logic signals from a row decoder circuit.

Drain biasing for the memory array is provided by high-voltage drain-bias transistors that are located in a column-decoder area of the integrated circuit. High-voltage transistor 104 is turned on to bias the drains of the programming transistors in the first column of the array; high-voltage transistor 106 is turned on to bias the drains of the programming transistors in the second and third columns of the array; and high-voltage transistor 108 is turned on to bias the drains of the programming transistors in the fourth column of the array.

The gates of transistors 104, 106, and 108 are driven by logic signals from the column decoder circuitry. Persons of ordinary skill in the art will appreciate that generation of these signals is simply a matter of exercise of routine skills with knowledge of the programming characteristics of the particular non-volatile memory transistors used in the design.

The drain-side segmentation of the FPGA memory cells according to the present invention reduces the number of rows seeing the ~5V programming voltage. This segmentation device can be utilized for n number of rows. The number n can be arbitrarily chosen depending upon the disturb mechanisms. In one proposed embodiment, n=512 rows.

Figure 2:
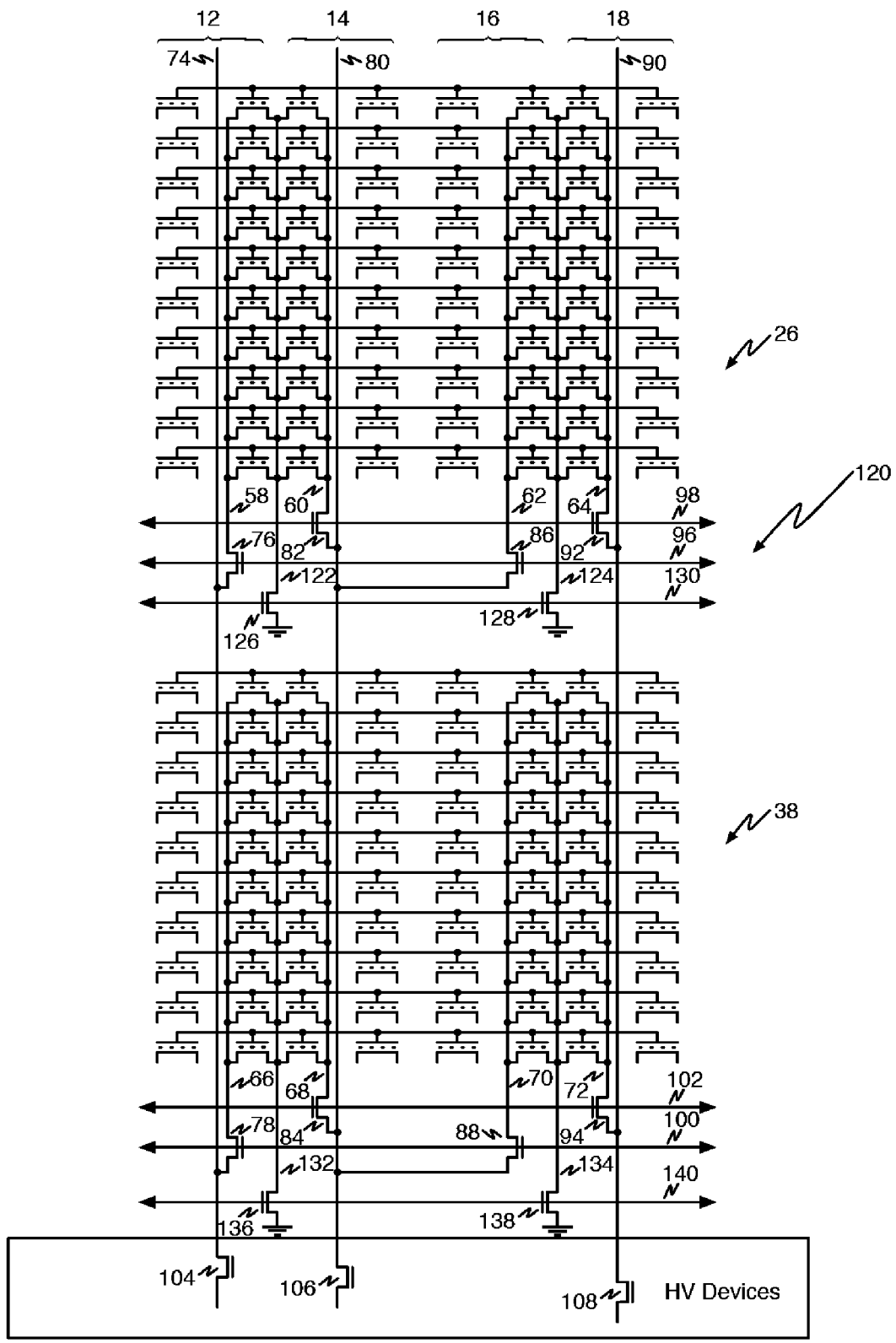
FIG. 2 is a schematic diagram of a portion of a segmented Flash memory array according to another aspect of the present invention.

Referring now to FIG. 2, a schematic diagram shows a portion of a Flash memory array 120 according to another aspect of the present invention. The details of the memory cells and their segmentation are the same as shown in FIG. 1, and discussion of those details will not be repeated.

As in the embodiment of FIG. 1, the drain lines of the upper and lower segments of the array are coupled to column lines through high-voltage segment-select transistors. Thus, drain lines 62 and 70 of the upper and lower segments in the first column of the array are coupled to a column line 72 through segment-select transistors 74 and 76, respectively. Similarly, drain lines 64 and 72 of the upper and lower segments in the second column of the array are coupled to a column line 78 through segment-select transistors 80 and 82, respectively. Drain lines 66 and 74 of the upper and lower segments in the third column of the array share column line 78 with the drains of the memory transistors in the second column and are thus coupled to the column line 78 through segment-select transistors 84 and 86, respectively. Drain lines 68 and 76 of the upper and lower segments in the fourth column of the array are coupled to a column line 88 through segment-select transistors 90 and 92, respectively. One segment-select transistor is used for each cluster of rows making up a segment.

Unlike the embodiment shown in FIG. 1, the connection of the sources of all of the pairs of programming transistors is segmented. All of the pairs of programming transistors in the upper segment 26 of the first and second columns of the array are coupled together to a common source line 122. The sources of all of the pairs of programming transistors in the third and fourth columns of the array are coupled together to a common source line 124. Source biasing for the upper segments of the memory array is provided by source-bias transistor 126 and coupled to common source line 122 and source-bias transistor 128 and coupled to common source line 124. Source-bias transistors 126 and 128 are driven by logic signals from a row-decoder area of the integrated circuit. A gate line 130 is coupled to the gates of source-bias transistors 126 and 128.

Similarly, the sources of all of the pairs of programming transistors in the lower segment of the first and second columns of the array are coupled together to a common source line 132. The sources of all of the pairs of programming transistors in the lower segment of the third and fourth columns of the array are coupled together to a common source line 134. Source biasing for the upper segments of the memory array is provided by source-bias transistor 136 and coupled to common source line 132 and source-bias transistor 138 and coupled to common source line 134. Source-bias transistors 136 and 138 are also driven by logic signals from a row-decoder area of the integrated circuit. A gate line 140 is coupled to the gates of source-bias transistors 136 and 138.

Unlike the global common source lines employed in the embodiment of FIG. 1, the arrangement shown in FIG. 2 separately uses source-bias transistors 126 and 128 and 136 and 138 for the upper and lower segments 26 and 38 to provide local source bias for the n rows in each of the upper and lower segments 26 and 38. This substantially lessens the effects of IR drop on the metal lines used to form the source lines, since they do not span the entire column.

An alternate configuration of the present invention is to employ a separate drain line for each memory cell. This increases the number of sense amps but simplifies the decoding structure. This is shown in FIG. 3.

Figure 3:
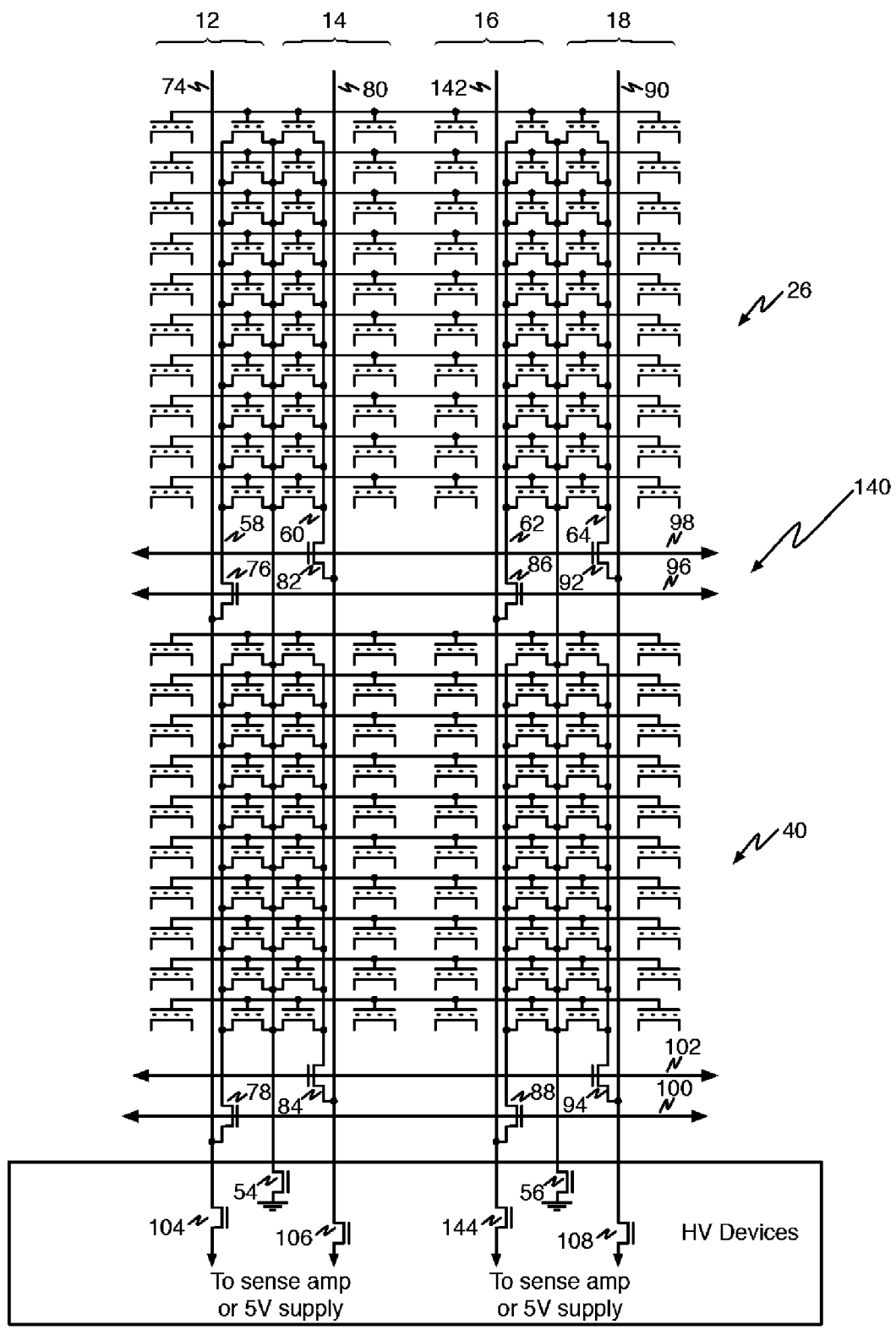
FIG. 3 is a schematic diagram of a portion of a segmented Flash memory array according to another aspect of the present invention.

Referring now to FIG. 3, a schematic diagram shows a portion of a Flash memory array 140 according to yet another aspect of the present invention. The details of the memory cells and their segmentation are the same as shown in FIGS. 1 and 2, and discussion of those details will not be repeated.

The embodiment of FIG. 3 is similar to the embodiment of FIG. 1 in that the column lines are global and not segmented as they are in the embodiment of FIG. 2. However, the embodiment of FIG. 3 differs from the embodiment of FIG. 2 in that a separate column line 142 is provided for the third column in the array, which does not share column line 80 with the second column in the array. Instead, segment-select transistor 86 is coupled to column line 142. An additional high-voltage transistor 144 is provided in the column decoder to bias column line 142. As with the other embodiments disclosed herein, all of the select transistors are driven by logic signals from the column decoder circuitry. Persons of ordinary skill in the art will appreciate that generation of these signals is simply a matter of exercise of routine skills with knowledge of the programming characteristics of the particular non-volatile memory transistors used in the design.

The present invention is an efficient segmentation scheme that solves all the flash-disturb mechanisms, while at the same time being extremely efficient on metal usage. Segmenting the array from the drain side of the FPGA cell reduces the number of rows seeing the ~5 v programming voltage. The local bitline is shared by n-rows, where n can be any arbitrary number. The limitation here is the gate-induced drain leakage. The source side can be global as shown in FIGS. 1 and 3 or can be local as shown in FIG. 2. Both schemes not only allow minimization of the disturb conditions but also gives the required source bias for suppressing any background leakage without costing much in diffusion or metal area. The two local segment select devices can share a common diffusion, hence further reducing the area required to put these device.

While embodiments and applications of this invention have been shown and described, it would be apparent to those skilled in the art that many more modifications than mentioned above are possible without departing from the inventive concepts herein. The invention, therefore, is not to be restricted except in the spirit of the appended claims.

What is claimed is:

1. A non-volatile memory array for a field-programmable-gate-array device having drain-side segmentation and comprising:
   a plurality of memory cells arranged as an array of rows and columns, the array divided into a plurality of segments, each segment including a plurality of rows, each memory cell including a non-volatile memory transistor having a source, a drain, a floating gate, and a control gate, the source of each non-volatile memory transistor in each segment coupled together to a common source line, the non-volatile memory transistors in each segment being formed in a well associated only with that segment;
   at least one switch transistor associated with each non-volatile memory transistor, the at least one switch transistor having a source, a drain, a floating gate and a control gate and wherein each non-volatile memory transistor shares a floating gate with its associated at least one switch transistor;
   a column line associated with each column in the array;
   a column segment line associated with each segment of the array, each column segment line coupled to the drains of each non-volatile memory transistor in the segment;
   a segment select transistor coupled between each column segment line and its associated column line; and
   a high-voltage driver transistor coupled to each column line.

2. The non-volatile memory array of claim 1 wherein the sources of non-volatile memory transistors in adjacent columns are coupled to the same common source line.

3. The non-volatile memory array of claim 2 wherein each common source line is coupled to a source-bias transistor.

4. The non-volatile memory array of claim 3 wherein each source-bias transistor is coupled to ground.

5. The non-volatile memory array of claim 4 wherein the source-bias transistors associated with segments that include non-volatile memory transistors in the same rows are all controlled by a single gate line.

6. The non-volatile memory array of claim 1 wherein the non-volatile memory transistors in a single segment in adjacent pairs of odd-even columns are formed in the same well.

7. The non-volatile memory array of claim 6 wherein the non-volatile memory transistors are n-channel MOS transistors and the well is a p-well.

8. The non-volatile memory array of claim 1 wherein the control gates all non-volatile memory transistors and all of the least one switch transistors in a single row of the array are coupled together.

9. The non-volatile memory array of claim 1 wherein all of the at least one switch transistors associated with non-volatile memory transistors in a segment of a column of the array are formed in a single well.

10. The non-volatile memory array of claim 9 wherein all of the at least one switch transistors are n-channel MOS transistors and the well is a p-well.

11. The non-volatile memory array of claim 1 wherein the sources of non-volatile memory transistors in adjacent columns of the same segment are coupled to the same common source line.

12. The non-volatile memory array of claim 11 wherein each common source line is coupled to a source-bias transistor.

13. The non-volatile memory array of claim 12 wherein each source-bias transistor is coupled to ground.

14. The non-volatile memory array of claim 12 wherein the source-bias transistors associated with segments that include non-volatile memory transistors in the same rows are all controlled by a single gate line.

15. A non-volatile memory array for a field-programmable-gate-array device having drain-side segmentation and comprising:
- a plurality of memory cells arranged as an array of rows and columns, the array divided into a plurality of segments, each segment including a plurality of rows, each memory cell including a non-volatile memory transistor having a source, a drain, a floating gate, and a control gate, the source of each non-volatile memory transistor in each segment coupled together to a segment source line, the non-volatile memory transistors in each segment being formed in a well associated only with that segment;
- at least one switch transistor associated with each non-volatile memory transistor, the at least one switch transistor having a source, a drain, a floating gate and a control gate and wherein each non-volatile memory transistor shares a floating gate with its associated at least one switch transistor;
- a plurality of column lines associated with the array, neighboring ones of the non-volatile memory transistors in adjacent pairs share a common column line;
- a column segment line associated with each segment of the array, each column segment line coupled to the drains of each non-volatile memory transistor in the segment;
- a segment select transistor coupled between each column segment line and its associated column line; and
- a high-voltage driver transistor coupled to each column line.

16. The non-volatile memory array of claim 15 wherein the sources of non-volatile memory transistors in adjacent columns are coupled to the same segment source line.

17. The non-volatile memory array of claim 16 wherein each segment source line is coupled to a source-bias transistor.

18. The non-volatile memory array of claim 17 wherein each source-bias transistor is coupled to ground.

19. The non-volatile memory array of claim 18 wherein the source-bias transistors associated with segments that include non-volatile memory transistors in the same rows are all controlled by a single gate line.

20. The non-volatile memory array of claim 15 wherein the non-volatile memory transistors in a single segment in adjacent pairs of odd-even columns are formed in the same well.

21. The non-volatile memory array of claim 20 wherein the non-volatile memory transistors are n-channel MOS transistors and the well is a p-well.

22. The non-volatile memory array of claim 15 wherein the control gates all non-volatile memory transistors and all of the least one switch transistors in a single row of the array are coupled together.

23. The non-volatile memory array of claim 15 wherein all of the at least one switch transistors associated with non-volatile memory transistors in a segment of a column of the array are formed in a single well.

24. The non-volatile memory array of claim 23 wherein all of the at least one switch transistors are n-channel MOS transistors and the well is a p-well.

25. The non-volatile memory array of claim 15 wherein the sources of non-volatile memory transistors in adjacent columns of the same segment are coupled to the same segment source line.

26. The non-volatile memory array of claim 25 wherein each segment source line is coupled to a source-bias transistor.

27. The non-volatile memory array of claim 26 wherein each source-bias transistor is coupled to ground.

28. The non-volatile memory array of claim 26 wherein the source-bias transistors associated with segments that include non-volatile memory transistors in the same rows are all controlled by a single gate line.

* * * * *